(12) United States Patent
You et al.

(10) Patent No.: US 11,888,125 B2
(45) Date of Patent: Jan. 30, 2024

(54) BATTERY MODULE HAVING CONNECTOR MOUNTED ON FPCB, AND BATTERY PACK AND VEHICLE COMPRISING SAME

(71) Applicant: LG Chem, Ltd., Seoul (KR)

(72) Inventors: Jae-Hyun You, Daejeon (KR); Jong-Ha Jeong, Daejeon (KR); Young-Ho Lee, Daejeon (KR); Jun-Yeob Seong, Daejeon (KR)

(73) Assignee: LG Energy Solution, Ltd.

( * ) Notice: Subject to any disclaimer, the term of this patent is extended or adjusted under 35 U.S.C. 154(b) by 577 days.

(21) Appl. No.: 17/055,419

(22) PCT Filed: Dec. 20, 2019

(86) PCT No.: PCT/KR2019/018239
§ 371 (c)(1),
(2) Date: Nov. 13, 2020

(87) PCT Pub. No.: WO2020/138869
PCT Pub. Date: Jul. 2, 2020

(65) Prior Publication Data
US 2021/0151804 A1 May 20, 2021

(30) Foreign Application Priority Data
Dec. 26, 2018 (KR) .................... 10-2018-0169964

(51) Int. Cl.
*H01M 10/42* (2006.01)
*H01M 50/502* (2021.01)
(Continued)

(52) U.S. Cl.
CPC ..... *H01M 10/425* (2013.01); *H01M 10/0413* (2013.01); *H01M 50/178* (2021.01);
(Continued)

(58) Field of Classification Search
None
See application file for complete search history.

(56) References Cited

U.S. PATENT DOCUMENTS

| 2012/0019061 A1 | 1/2012 | Nishihara et al. |
| 2015/0086845 A1 | 3/2015 | Chang et al. |

(Continued)

FOREIGN PATENT DOCUMENTS

| CN | 108463902 A | 8/2018 |
| CN | 207800816 U | 8/2018 |

(Continued)

OTHER PUBLICATIONS

Machine Translation of KR20160077755 (Year: 2016).*
Search Report of European Application No. 19904880.2 dated Oct. 1, 2021. 2 pgs.
International Search Report for Application No. PCT/KR2019/018239 dated Apr. 3, 2020, 2 pages.

*Primary Examiner* — Wyatt P Mcconnell
(74) *Attorney, Agent, or Firm* — Lerner David LLP

(57) ABSTRACT

Disclosed is a battery module, which includes a cell stack formed by stacking a plurality of battery cells; a bus bar frame assembly including a bus bar frame covering first and second opposite longitudinal ends of the cell stack and a plurality of bus bars fixed to the bus bar frame and electrically connected to the battery cells; and a FPCB assembly including a first FPCB extending along a longitudinal direction of the cell stack and covering at least a portion of an upper surface of the cell stack, a second FPCB extending from one longitudinal end of the first FPCB and electrically connected to the bus bars, and a connector having a connector pin inserted into a pin insert hole formed in the second FPCB.

10 Claims, 10 Drawing Sheets

(51) Int. Cl.
*H01M 50/531* (2021.01)
*H01M 50/204* (2021.01)
*H01M 10/04* (2006.01)
*H01R 12/77* (2011.01)
*H01M 50/50* (2021.01)
*H01M 50/178* (2021.01)
*H01M 50/548* (2021.01)
*H01M 50/211* (2021.01)
*H01M 50/284* (2021.01)
*H01M 50/289* (2021.01)
*H01M 50/569* (2021.01)
*H01M 50/271* (2021.01)

(52) U.S. Cl.
CPC ....... *H01M 50/204* (2021.01); *H01M 50/211* (2021.01); *H01M 50/284* (2021.01); *H01M 50/50* (2021.01); *H01M 50/502* (2021.01); *H01M 50/531* (2021.01); *H01M 50/548* (2021.01); *H01R 12/77* (2013.01); *H01M 50/271* (2021.01); *H01M 50/289* (2021.01); *H01M 50/569* (2021.01); *H01M 2220/20* (2013.01)

(56) References Cited

U.S. PATENT DOCUMENTS

| 2017/0324075 | A1 | 11/2017 | Dulle et al. |
| 2019/0001838 | A1 | 1/2019 | Choi et al. |
| 2019/0305265 | A1* | 10/2019 | Wynn ................. H01M 50/209 |
| 2019/0348720 | A1* | 11/2019 | Oh ..................... H01M 50/567 |

FOREIGN PATENT DOCUMENTS

| EP | 3605741 | A1 | 2/2020 |
| EP | 3734745 | A1 | 11/2020 |
| JP | 2013143281 | A | 7/2013 |
| JP | 5621765 | B2 | 11/2014 |
| KR | 20060134549 | A | 12/2006 |
| KR | 20140095660 | A | 8/2014 |
| KR | 20150144852 | A | 12/2015 |
| KR | 20160046825 | A | 4/2016 |
| KR | 20160077755 | | * 7/2016 |
| KR | 101654997 | B1 | 9/2016 |
| KR | 20180099438 | A | 9/2018 |
| WO | 2018124494 | A2 | 7/2018 |
| WO | 2018124751 | A1 | 7/2018 |

* cited by examiner

BATTERY MODULE HAVING CONNECTOR MOUNTED ON FPCB, AND BATTERY PACK AND VEHICLE COMPRISING SAME

CROSS-REFERENCE TO RELATED APPLICATIONS

The present disclosure relates to a battery module including a connector mounted on a FPCB, and a battery pack and a vehicle including the battery module, and more particularly, to a battery module including a connector mounted to both ends of a FPCB installed across a cell stack and provided using a space formed by biased arrangement of an electrode lead, and a battery pack and a vehicle including the battery module.

The present application is a national phase entry under 35 U.S.C. § 371 of International Application No. PCT/KR2019/018239, filed on Dec. 20, 2019, which claims priority to Korean Patent Application No. 10-2018-0169964, filed on Dec. 26, 2018, the disclosures of which are incorporated herein by reference.

TECHNICAL FIELD

The present disclosure relates to a battery module including a connector mounted on a FPCB, and a battery pack and a vehicle including the battery module, and more particularly, to a battery module including a connector mounted to both ends of a FPCB installed across a cell stack and provided using a space formed by biased arrangement of an electrode lead, and a battery pack and a vehicle including the battery module.

BACKGROUND ART

A control device such as a battery management system (BMS) for controlling charging and discharging of a battery module by using information such as voltage of each battery cell and temperature of a cell stack of the battery module may be connected to the battery module. In order to connect the control device, it is necessary to install a connector that is electrically connected to each battery cell of the battery module and also electrically connected to a temperature sensor for measuring a temperature of the cell stack.

Conventionally, in connecting a flexible printed circuit board (FPCB) used for electrical connection between components to a connector, after a terminal is compressed to the FPCB, an end of the FPCB at which the terminal is compressed is inserted and fixed into the connector.

In this case, the process of compressing each terminal individually to the FPCB is required, which is not efficient in terms of productivity. Also, since the electrical connection between the FPCB and the connector is made using the terminal compressed to the FPCB, there is a high risk of contact failure when vibration or impact is applied thereto.

In addition, even if one of various terminals has a contact failure with the FPCB or a compression failure occurs during the terminal compressing process, an error may occur in voltage measurement of the battery cell.

Thus, there is a need to improve the connection structure between the FPCB and the connector in order to solve the above problems of deteriorated productivity and increased defect rate.

In addition, due to the space occupied by the connector installed to sense a voltage or the like of each battery cell, the entire volume of the battery module is inevitably increased. If the volume of the battery module is increased without increasing the capacity of the cell stack, there is a loss in terms of energy density.

Thus, there is a demand for a structural improvement capable of minimizing the increase in volume of the battery module caused by installing the connector.

DISCLOSURE

Technical Problem

The present disclosure is designed to solve the problems of the related art, and therefore the present disclosure is directed to enhancing the structure for electrical connection between a FPCB and a connector to improve productivity and reduce defect rate, and also minimizing the increase in volume of a battery module caused by installing the connector.

However, the technical problem to be solved by the present disclosure is not limited to the above, and other objects not mentioned herein will be understood from the following description by those skilled in the art.

Technical Solution

In one aspect of the present disclosure, there is provided a battery module, comprising: a cell stack formed by stacking a plurality of battery cells; a bus bar frame assembly including a bus bar frame configured to cover one longitudinal end and the other longitudinal end of the cell stack and a plurality of bus bars fixed on the bus bar frame and electrically connected to the battery cells; and a FPCB assembly including a first FPCB extending along a longitudinal direction of the cell stack to cover at least a portion of an upper surface of the cell stack, a second FPCB extending from one longitudinal end of the first FPCB and electrically connected to the bus bars, and a connector having a connector pin inserted into a pin insert hole formed in the second FPCB.

The battery cell may include an electrode assembly; a pair of electrode leads connected to the electrode assembly and extending in opposite directions along a longitudinal direction of the battery cell; and a cell case configured to accommodate the electrode assembly and sealed to expose the electrode lead to the outside.

The pair of electrode leads may be formed at locations biased downward from a center of the cell stack in a height direction.

The bus bar frame may have a FPCB placing portion provided in a space formed above the electrode lead due to biasing of the electrode lead.

The second FPCB may include a connector mounting portion placed on the FPCB placing portion and having the pin insert hole.

The connector may be mounted on the connector mounting portion.

The bus bar frame may have a fixing pin provided in the space formed above the electrode lead due to biasing of the electrode lead.

The connector may have a fixing portion in which a fixing hole is formed so that the fixing pin is inserted therein.

The FPCB assembly may comprise a stiffener interposed between the connector and the connector mounting portion and having a perforation hole formed at a location corresponding to the connector pin and the pin insert hole.

Meanwhile, in another aspect of the present disclosure, there are also provided a battery pack and a vehicle, which comprises the battery module according to an embodiment of the present disclosure.

Advantageous Effects

According to an embodiment of the present disclosure, it is possible to improve productivity and reduce defect rate by enhancing the structure for electrical connection between a FPCB and a connector, and the increase in volume of the battery module caused by installing the connector may be minimized.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the scope of the disclosure.

First, the overall configuration of a battery module according to an embodiment of the present disclosure will be described with reference to FIGS. 1 to 4.

Figure 1:
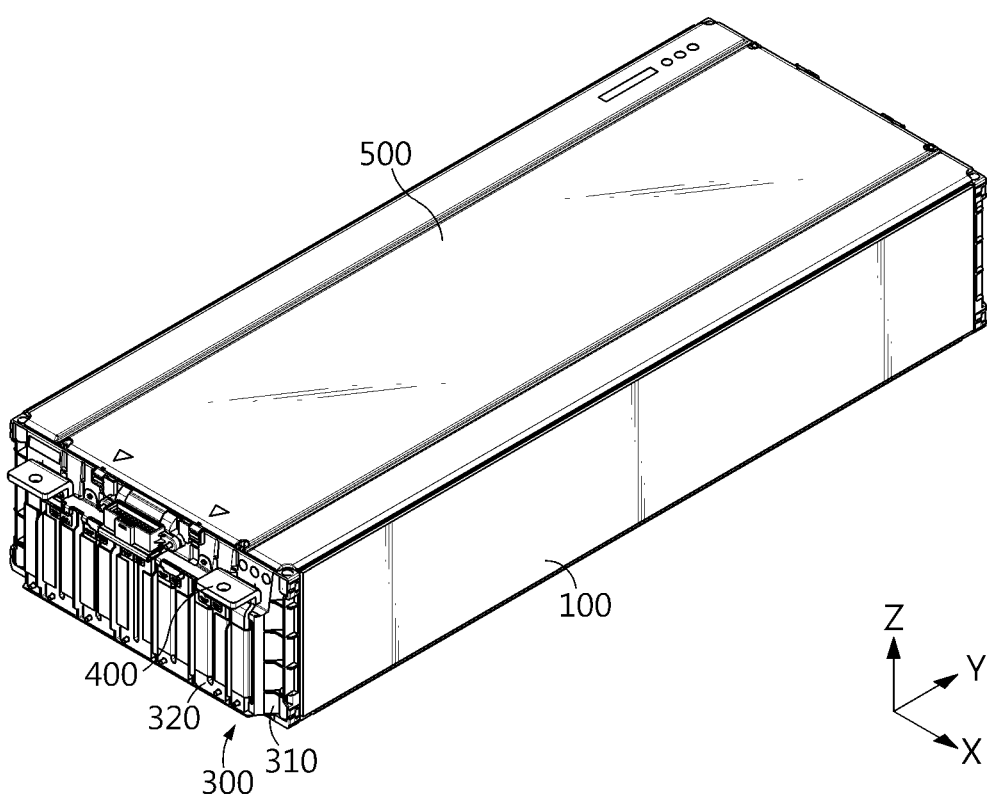
FIG. 1 is a perspective view showing a battery module according to an embodiment of the present disclosure.
Figure 2:
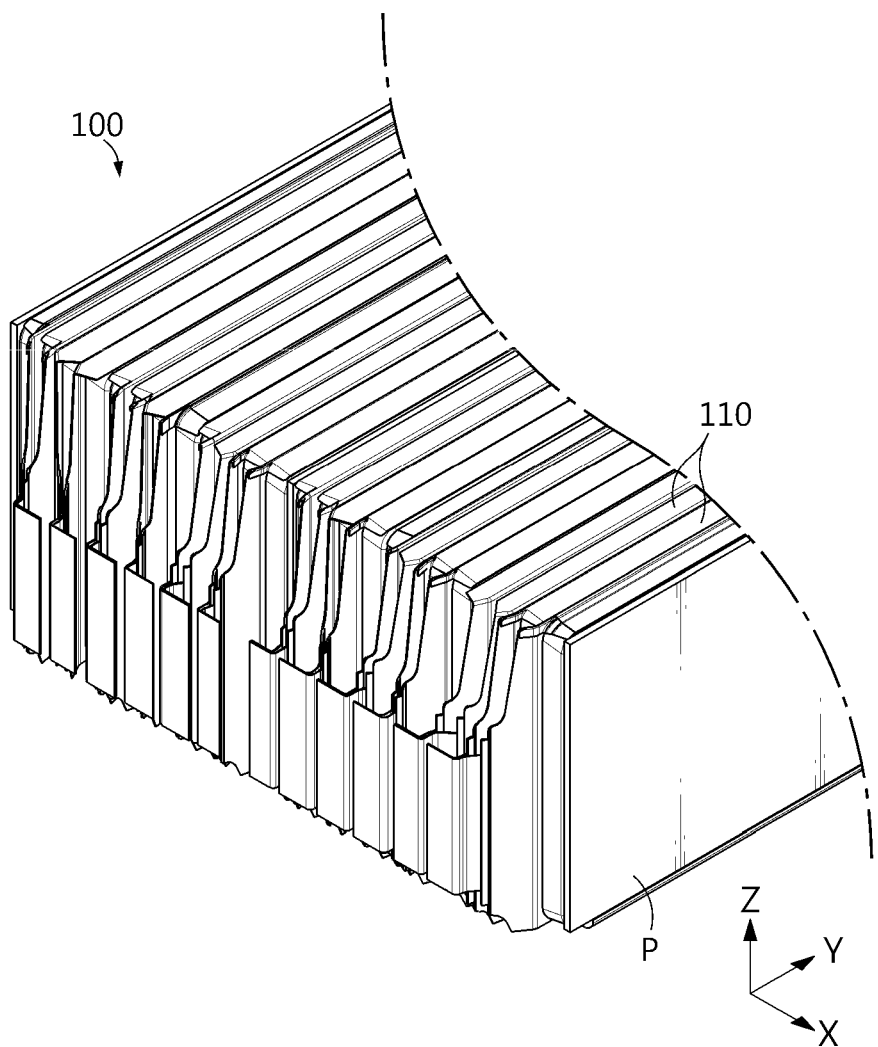
FIG. 2 is a perspective view showing a cell stack applied to the battery module according to an embodiment of the present disclosure.
Figure 3:
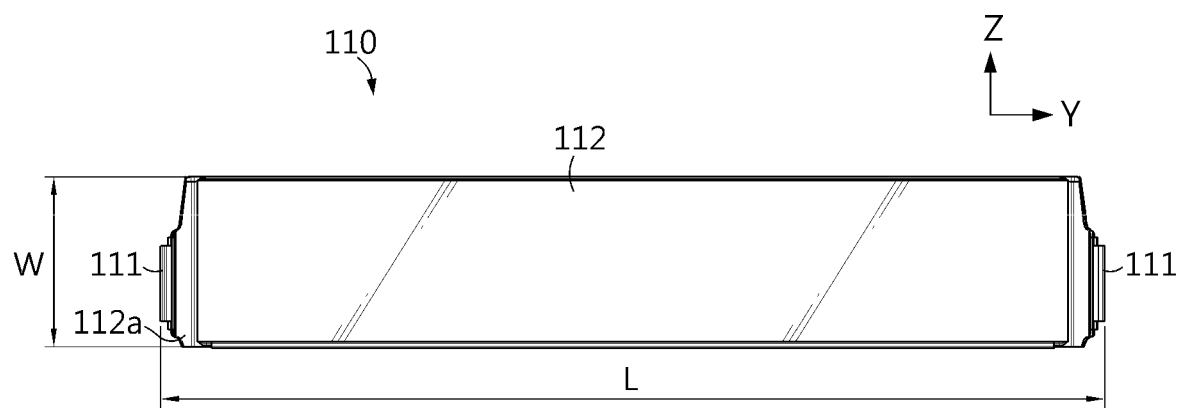
FIG. 3 is a plan view showing a battery cell applied to the battery module according to an embodiment of the present disclosure.
Figure 4:
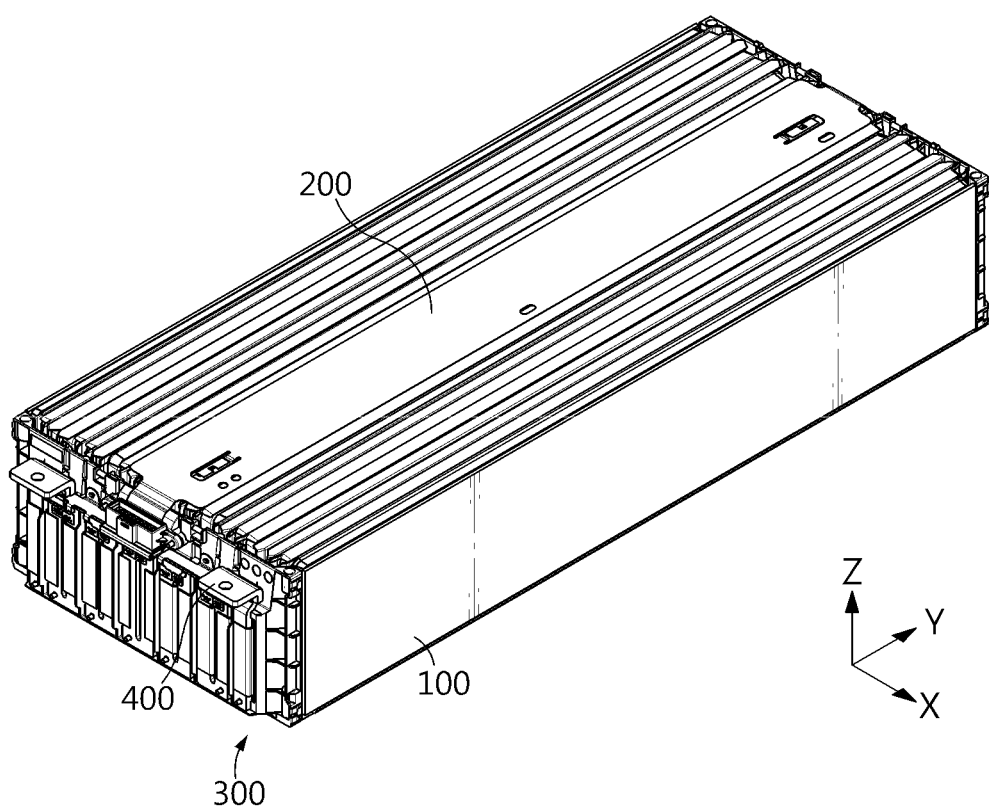
FIG. 4 is a perspective view showing the battery module according to an embodiment of the present disclosure, from which an upper cover is eliminated.

FIG. 1 is a perspective view showing a battery module according to an embodiment of the present disclosure, and FIG. 2 is a perspective view showing a cell stack applied to the battery module according to an embodiment of the present disclosure. Also, FIG. 3 is a plan view showing a battery cell applied to the battery module according to an embodiment of the present disclosure, and FIG. 4 is a perspective view showing the battery module according to an embodiment of the present disclosure, from which an upper cover is eliminated.

Referring to FIGS. 1 to 4, a battery module according to an embodiment of the present disclosure may be implemented to include a cell stack 100, a FPCB assembly 200, a bus bar frame assembly 300, an outer terminal 400 and an upper cover 500.

The cell stack 100 includes a plurality of battery cells 110 stacked to face each other at wide surfaces thereof. The cell stack 100 may include at least one buffer pad P interposed at an outermost battery cell 110 and/or between adjacent battery cells 110.

That is, the cell stack 100 may be inserted into a mono frame (not shown) in a state of being coupled with the FPCB assembly 200, the bus bar frame assembly 300, the outer terminal 400 and the upper cover 500. At this time, in order to insert the cell stack 100 easily while securing a maximum volume of the cell stack 100, the buffer pad P made of an elastic material such as a sponge may be additionally applied.

A pouch-type battery cell may be applied as the battery cell 110. Referring to FIG. 3, the pouch-type battery cell 110 includes an electrode assembly (not shown), a pair of electrode leads 111 and a cell case 112.

Although not shown in the drawings, the electrode assembly has a form in which separators are interposed between positive electrode plates and negative electrode plates that are repeatedly stacked alternately, and separators are preferably positioned at both outermost sides for insulation, respectively.

The positive electrode plate includes a positive electrode current collector and a positive electrode active material layer coated on one side of the positive electrode current collector, and a positive electrode uncoated region not coated with a positive electrode active material is formed at one side end of the positive electrode plate. The positive electrode uncoated region functions as a positive electrode tab.

The negative electrode plate includes a negative electrode current collector and a negative electrode active material layer coated on one surface or both sides of the negative electrode current collector, and a negative electrode uncoated region not coated with a negative electrode active material is formed at one side end of the negative electrode plate. The negative electrode uncoated region functions as a negative electrode tab.

In addition, the separator is interposed between the positive electrode plate and the negative electrode plate to prevent electrode plates having different polarities from directly contacting each other. The separator may be made of a porous material so that ions may be moved using the electrolyte as a medium between the positive electrode plate and the negative electrode plate.

The pair of electrode leads 111 are connected to the positive electrode tab (not shown) and the negative electrode tab (not shown), respectively, and are drawn out of the cell case 112. The pair of electrode leads 111 are drawn out at one longitudinal side and the other longitudinal side of the battery cell 110, respectively. That is, the battery cell 110 applied to the present disclosure corresponds to a bidirectional draw-out battery cell in which the positive electrode lead and the negative electrode lead are drawn in opposite directions.

In addition, the pair of electrode leads 111 are positioned to be biased to one side from a center of the battery cell 110 in a width direction (the Z-axis direction of FIG. 3). Specifically, the pair of electrode leads 111 are positioned to be biased to one side from the center of the battery cell 110 in the width direction, preferably to be biased downward along the height direction (the Z-axis direction of FIG. 2) of the cell stack 100.

If the pair of electrode leads 111 are positioned to be biased to one side from the center of the battery cell 110 in the width direction as described above, it is possible to give a space for installation of a connector 240 (see FIG. 5), explained later, and an outer terminal (see FIG. 1) so that the energy density of the battery module is improved. The increase in energy density due to the structure in which the electrode lead 111 is installed to be biased will be described in detail later.

The cell case 112 includes two regions, namely an accommodation portion accommodating the electrode assembly and a sealing portion extending in a circumferential direction of the accommodation portion and thermally fused in a state where the electrode lead 111 is drawn out to seal the cell case 112.

Although not shown in the figures, the cell case 112 is sealed by affixing and thermally fusing edge portions of an upper case and a lower case made of a multi-layered pouch film in which a resin layer, a metal layer and a resin layer are stacked in order.

In the sealing portion, a terrace portion 112a corresponding to a region located in the direction in which the electrode lead 111 is drawn out has a tapered shape such that both sides of the terrace portion 112a are cut so that the width thereof is gradually reduced along the drawing direction of the electrode lead 111. As described above, if the width of the terrace portion 112a is gradually reduced toward the outer side of the battery cell 110, the electrode lead 111 may be disposed to be biased, and the energy density of the battery module may be improved.

Meanwhile, the battery cell 110 applied to the present disclosure is a long cell where a ratio of length (L) to width (W) is about 3 or more and 12 or less. In the battery module according to the present disclosure, if the long cell type battery cell 110 is employed, it is possible to improve the capacity of the battery while minimizing the increase in the height of the battery module, which makes it easy to install the battery module at a lower part of a seat or a trunk of a vehicle.

Next, the FPCB assembly 200 will be described in detail with reference to FIGS. 5 to 9 along with FIG. 4.

Figure 5:
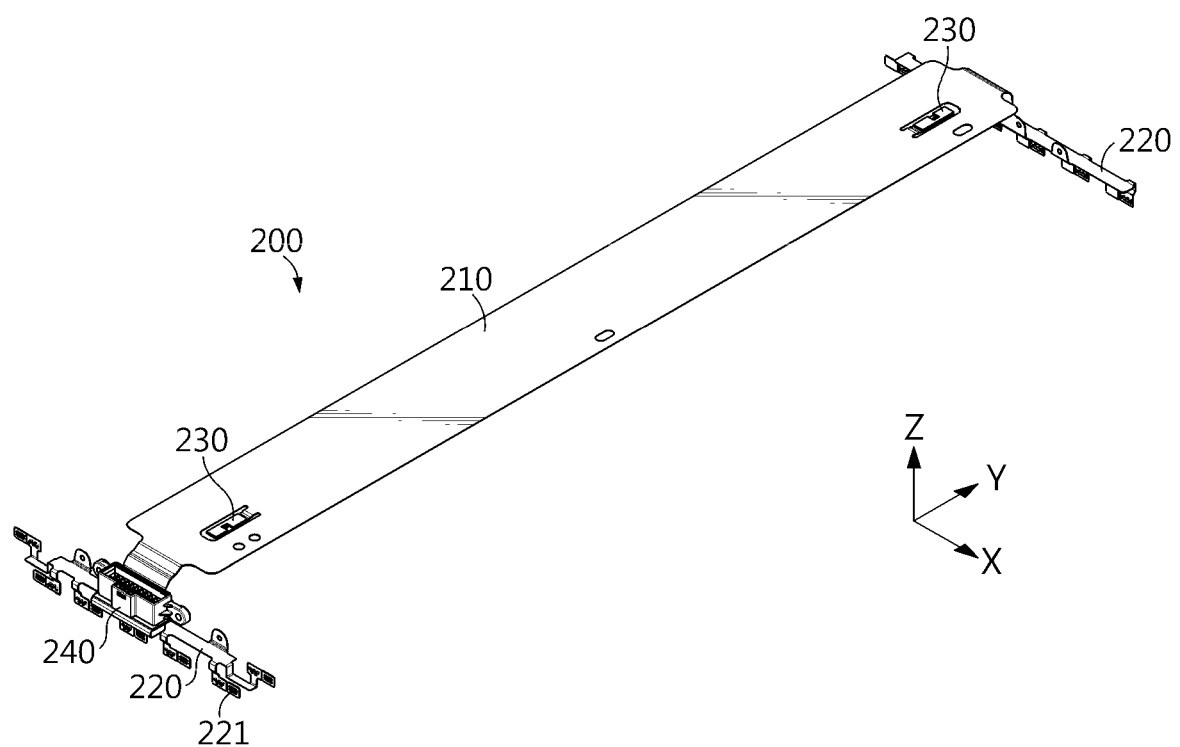
FIG. 5 is a perspective view showing a FPCB assembly applied to the battery module according to an embodiment of the present disclosure.
Figure 6:
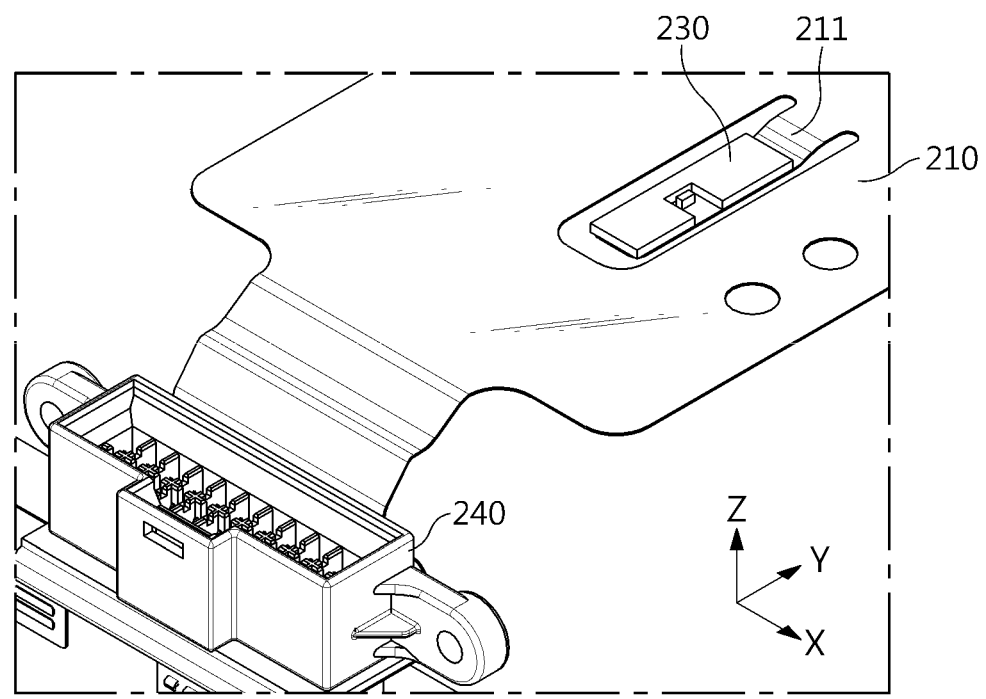
FIG. 6 is a partially enlarged view showing a portion of the FPCB assembly depicted in FIG. 5.
Figure 7:
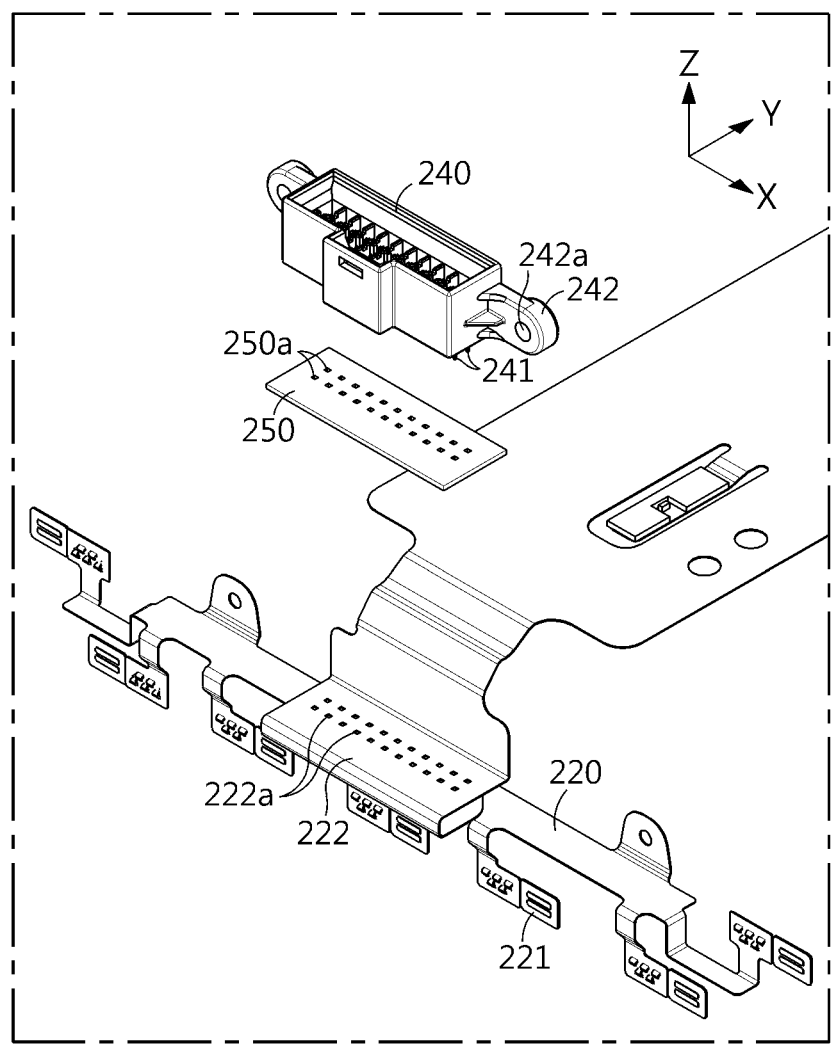
FIG. 7 is an exploded perspective view for illustrating a coupling structure of a second FPCB and a connector applied to the present disclosure.
Figure 8:
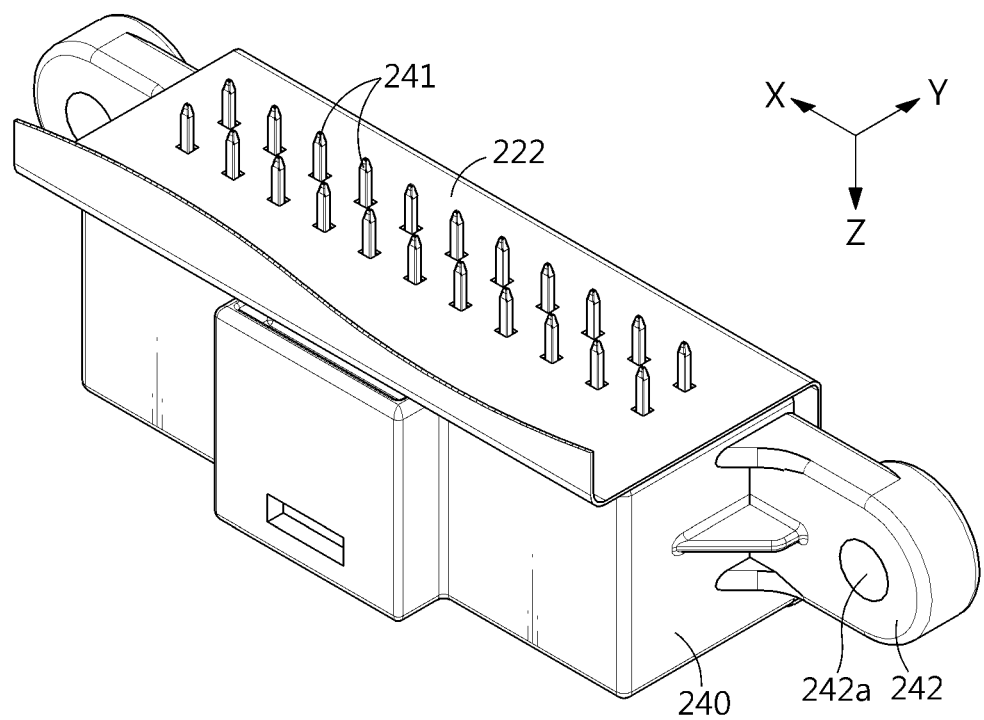
FIG. 8 is a diagram showing that the connector is coupled to the second FPCB applied to the present disclosure.
Figure 9:
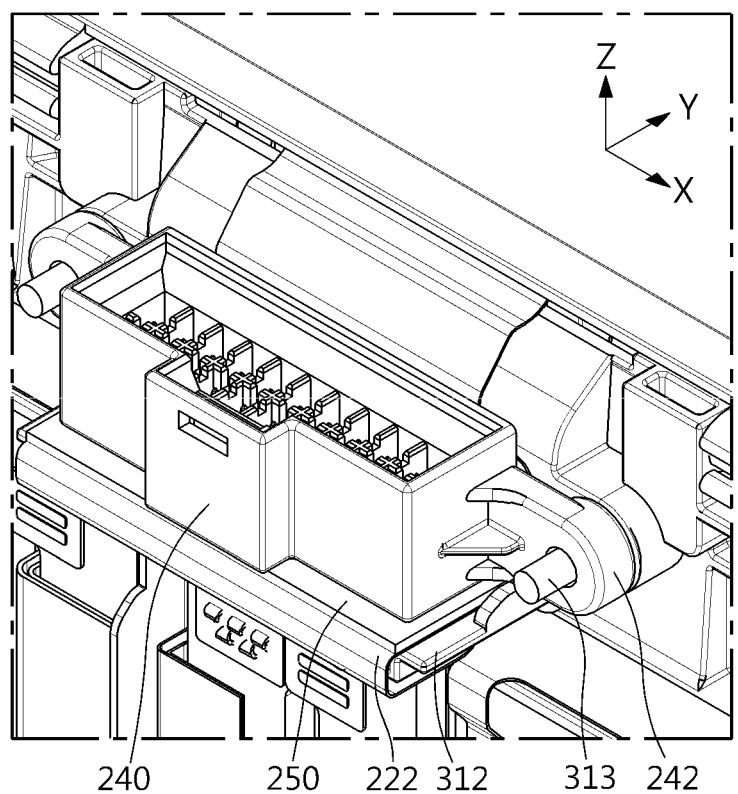
FIG. 9 is a diagram showing that the connector applied to the present disclosure is coupled to a bus bar frame.

FIG. 5 is a perspective view showing a FPCB assembly applied to the battery module according to an embodiment of the present disclosure, and FIG. 6 is a partially enlarged view showing a portion of the FPCB assembly depicted in FIG. 5. Also, FIG. 7 is an exploded perspective view for illustrating a coupling structure of a second FPCB and a connector applied to the present disclosure, FIG. 8 is a diagram showing that the connector is coupled to the second FPCB applied to the present disclosure, and FIG. 9 is a diagram showing that the connector applied to the present disclosure is coupled to a bus bar frame.

Referring to FIGS. 4 to 9, the FPCB assembly 200 may be implemented to include a first FPCB 210, a second FPCB 220, a temperature sensor 230 and a connector 240. In addition, the FPCB assembly 200 may be implemented to further include a stiffener 250 interposed between the second FPCB 220 and the connector 240.

In the present disclosure, the first FPCB 210 and the second FPCB 220 are described as components distinguished from each other, but the first FPCB 210 and the second FPCB 220 may be a single integrated flexible printed circuit board (FPCB). That is, the first FPCB 210 and the second FPCB 220 are just elements that are distinguished according to positions where they are disposed.

The first FPCB 210 extends along the longitudinal direction of the cell stack 100 (the Y-axis direction of FIGS. 4 and 5) to cover at least a portion of the upper surface of the cell stack 100. One longitudinal end of the first FPCB 210 is provided with a temperature sensor placing portion 211 formed by cutting a portion of the first FPCB 210.

The temperature sensor 230 is mounted to the upper surface of the temperature sensor placing portion 211, whereby the temperature sensor 230 is installed at positions corresponding to both ends of the cell stack 100 in the longitudinal direction (the Y-axis of FIG. 4). In addition, the temperature sensor placing portion 211 is located at the center of the cell stack 100 in the width direction (the X-axis of FIG. 4). Accordingly, the temperature sensor 230 is installed at a position corresponding to the center of the cell stack 100 in the width direction.

The position where the temperature sensor placing portion 211 is formed is selected to sense a temperature of a portion with the highest temperature in the cell stack 100. The FPCB assembly 200 may be connected to a control device that may control charging and discharging of the battery module, such as a battery management system (BMS). If the temperature of the battery module rises above a reference value, in order to ensure safety in use of the battery module, it is preferable to measure the temperature at a location with the highest temperature to control charging and discharging.

Thus, in the longitudinal direction of the cell stack 100 (the Y-axis direction of FIG. 4), both longitudinal ends closest to the electrode lead 111 become optimal positions, and in the width direction of the cell stack 100 (the X-axis direction of FIG. 4), the center where heat dissipation is most difficult becomes an optimal position.

As shown in FIG. 6, the temperature sensor placing portion 211 is formed by cutting a part of the first FPCB 210, and one of both longitudinal ends of the temperature sensor placing portion 211 is formed as a fixed end and the other is formed as a free end. In addition, both widthwise ends of the temperature sensor placing portion 211 are formed as free ends by cutting.

By doing so, the temperature sensor placing portion 211 may move up and down freely despite the characteristics of the FPCB having a certain degree of stiffness. Accordingly, the temperature sensor 230 mounted to the temperature sensor placing portion 211 is indirectly adhered to the cell stack 100 through the temperature sensor placing portion 211, thereby accurately measuring the temperature of the cell stack 100.

The second FPCB 220 is provided in a pair, and the second FPCBs 220 extend from both longitudinal ends of the first FPCB 210 and are electrically connected to a bus bar 320, explained later, respectively. That is, the second FPCB 220 has a plurality of connection terminals 221 formed at several branched ends, and the plurality of connection terminals 221 are connected to a plurality of bus bar 320, explained later.

In addition, the second FPCB 220 includes a connector mounting portion 222 for mounting the connector 240, and a plurality of pin insert holes 222a for connecting the connector 240 and the second FPCB 220 are formed in the connector mounting portion 222.

The connector 240 is mounted on the connector mounting portion 222 of the second FPCB 220, and the connector 240 is electrically connected to the connection terminal 221 through the FPCB. As described above, a control device (not shown) such as BMS is connected to the connector 240, and the control device receives information about a voltage of the battery cell 110 measured through the bus bar 320 and the connection terminal 221, information about a temperature of the cell stack 100 measured through the temperature sensor 230, or the like, and controls charging and discharging of the battery module with reference to the information.

The connector 240 includes a plurality of connector pins 241 for electrical connection with the second FPCB 220 and a fixing portion 242 for fixing with the bus bar frame 310. The plurality of connector pins 241 are inserted into the pin insert holes 222a formed in the connector mounting portion 222 of the second FPCB 220, fixed to the second FPCB 220 by welding at the rear side of the connector mounting portion 222, and also electrically connected to the second FPCB 220.

The fixing portion 242 may be provided in a pair at both sides of the connector 240, and includes a fixing hole 242a into which a fixing pin 313 provided to the bus bar frame 310, explained later, is inserted. The fixing pin 313 is thermally fused in a state of being inserted into the fixing hole 242a, so that the connector 240 is fixed to the bus bar frame 310.

Meanwhile, as described above, the stiffener 250 may be inserted between the second FPCB 220 and the connector 240. The stiffener 250 is provided to prevent that the welding portion between the connector pin 241 and the connector mounting portion 222 is damaged by vibration or the like due to the characteristics of the FPCB having relatively large ductility to break the electrical connection.

The stiffener 250 includes a plurality of perforation holes 250a formed at positions corresponding to the connector pins 241 and the pin insert holes 222a with a size and shape corresponding thereto, and the connector pin 241 passes through the perforation hole 250a and the pin insert hole 222a and is then fixed to the second FPCB 220 by welding at the rear side of the second FPCB 220.

Meanwhile, the stiffener 250 may be made of a material such as a reinforced resin in consideration of the purpose of preventing damage to components caused by vibration while having non-conductivity in order to ensure insulation between the plurality of connector pins 241.

Next, a specific arrangement position of the connector 240 will be described with reference to FIGS. 10 and 11.

Figure 10:
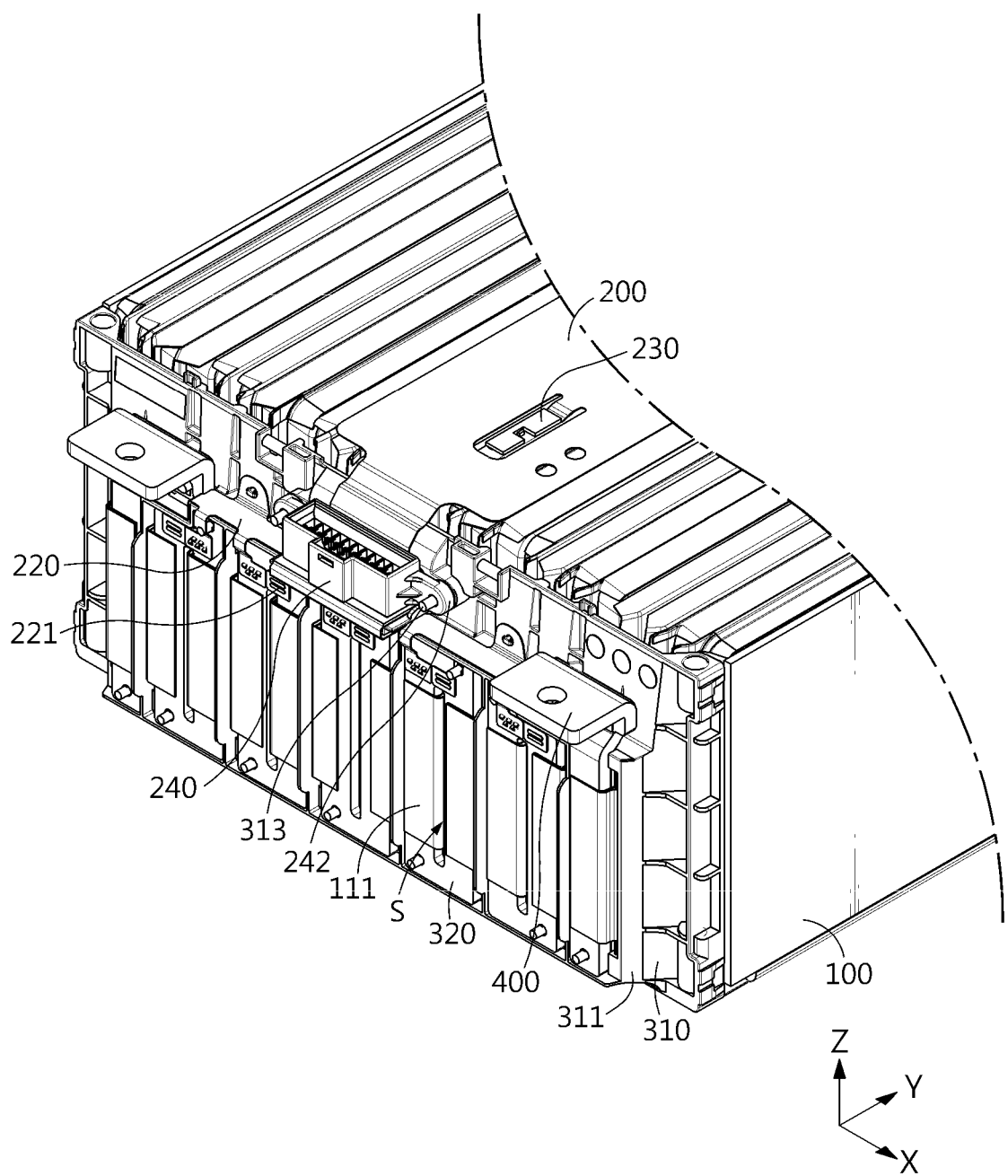
FIG. 10 is a partially enlarged view showing the battery module of FIG. 1.
Figure 11:
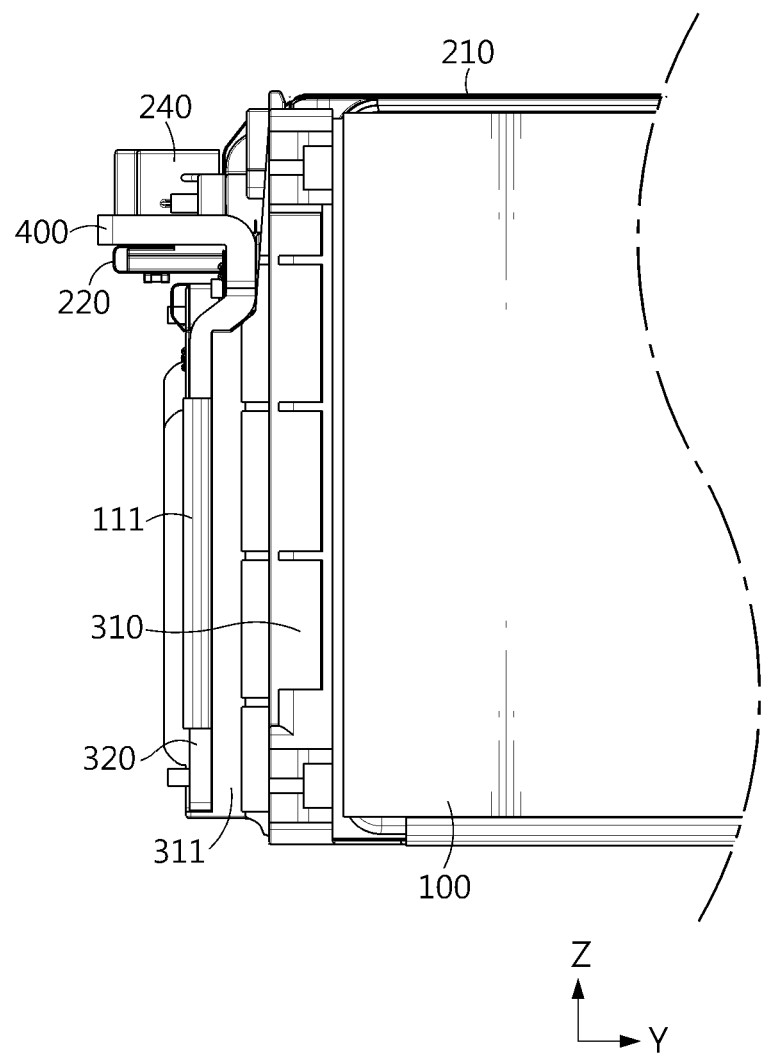
FIG. 11 is a side view showing the battery module of FIG. 10, observed from one side.

FIG. 10 is a partially enlarged view showing the battery module of FIG. 1, and FIG. 11 is a side view showing the battery module of FIG. 10, observed from one side.

Referring to FIGS. 10 and 11, the connector 240 mounted on the second FPCB 220 faces a front surface (a surface parallel to the X-Z plane of FIG. 10) of the cell stack 100 but is installed in a space formed above the electrode lead 111 due to biasing of the electrode lead 111. That is, the connector 240 is installed to face an upper portion of the front surface of the cell stack 100.

As such, the connector 240 is installed in the space provided due to the structure in which the electrode lead 111 is installed to be biased, which minimizes the overall volume increase of the battery module caused by the installation of the connector 240, thereby improving energy density.

Next, the bus bar frame assembly 300 and the outer terminal 400 applied to the present disclosure will be described in detail with reference to FIGS. 9 to 11.

Referring to FIGS. 9 to 11, the bus bar frame assembly 300 may be implemented to include a bus bar frame 310 configured to cover one longitudinal end and the other longitudinal end of the cell stack 100 and a plurality of bus bars 320 fixed on the bus bar frame 310 and electrically connected to the battery cells 110.

The bus bar frame 310, for example, may be made of an insulating material such as resin, and includes a bus bar placing portion 311 formed to protrude at a position corresponding to electrode leads 111 of the battery cell 110.

The bus bar placing portion 311 is formed at a position biased downward from the center of the cell stack 100 in the height direction (the Z-axis direction of FIGS. 10 and 11), like the electrode lead 111. The biasing of the bus bar placing portion 311 is to secure a space for installing components, similar to the biasing of the electrode lead 111.

The bus bar placing portion 311 has a plurality of lead slits S formed at positions corresponding to the electrode leads 111. Through the lead slits S, the electrode leads 111 are drawn out of the bus bar frame assembly 300, and the drawn electrode leads 111 are bent and fixed by welding or the like on the bus bar 320.

The bus bar frame 310 has an FPCB placing portion 312 on which the second FPCB 220 is placed in a state where the connector 240 is mounted thereto. The FPCB placing portion 312 is located above the bus bar placing portion 311 (in an upper direction along the Z-axis of FIG. 10), but is located at the center of the cell stack 100 in the width direction (the X-axis direction of FIG. 10). In addition, the FPCB placing portion 312 is provided in a space formed above the electrode lead 111 and the bus bar placing portion 311 due to the biasing of the electrode lead 111, thereby minimizing the increase in volume of the battery module caused by the installation of the connector 240.

The bus bar frame 310 includes a fixing pin 313 for fixing the connector 240. The fixing pin 313 is inserted into the fixing hole 242a formed in the fixing portion 242 of the connector 240, and an end of the fixing pin 313 is joined to the fixing portion 242 by thermal fusion so that the connector 240 may be fixed to the bus bar frame 310.

The outer terminal 400 is provided in a pair, and the outer terminals 400 are respectively connected to the bus bars 320 located at outsides of the both sides of the cell stack 100 in the width direction (the X-axis direction of FIG. 10).

Like the connector 240 described above, the outer terminal 400 is located in the space formed above the electrode lead 111 and the bus bar placing portion 311 due to the biasing of the electrode lead 111 and the bus bar placing portion 311. The location where the outer terminal 400 is formed may minimize the increase in volume of the battery module caused by installing the outer terminal 400 since it utilizes the space formed by the biasing of the electrode lead 111.

Next, the upper cover 500 will be described with reference to FIGS. 1 and 10.

Referring to FIGS. 1 and 1, the upper cover 500 corresponds to a component that covers an upper surface of the cell stack 100 (a surface parallel to the X-Y plane of FIGS. 1 and 10) and the first FPCB 210. The upper cover 500 is hinged to the pair of bus bar frames 310, respectively, and a gap is formed at a location corresponding to the connection portion of the first FPCB 210 and the second FPCB 220, so that the connection portion of the first FPCB 210 and the second FPCB 220 is drawn out of the upper cover 500 through the gap.

As described above, in the battery module according to the present disclosure, the connector 240 and the outer terminal 400 are installed using the space formed above the electrode lead 111 due to biasing of the electrode lead 111, thereby minimizing the increase in volume of the battery module caused by the installation of components and thus improving the energy density.

In addition, in the battery module according to the present disclosure, since the connector 240 is directly mounted to the FPCB using the pins provided to the connector 240 without performing the process of forming a separate terminal at the FPCB, it is possible to simplify the process for installing the connector 240 and remove the possibility of poor contact between the connector 240 and the FPCB, thereby improving the quality of the battery module.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

What is claimed is:

1. A battery module, comprising:
   a cell stack formed by stacking a plurality of battery cells;
   a bus bar frame assembly including a bus bar frame covering first and second opposite longitudinal ends of the cell stack and a plurality of bus bars fixed to the bus bar frame and electrically connected to the battery cells; and
   a FPCB assembly including a first FPCB extending along a longitudinal direction of the cell stack and covering at least a portion of an upper surface of the cell stack, a second FPCB extending from one longitudinal end of the first FPCB and electrically connected to the bus bars, and a connector having a connector pin inserted into a pin insert hole formed in the second FPCB,
   wherein the second FPCB includes a connector mounting portion having the pin insert hole extending therein,
   wherein the FPCB assembly further comprises a non-conductive stiffener interposed between the connector and the connector mounting portion, and
   wherein the stiffener has a perforation hole formed at a location corresponding to the connector pin and the pin insert hole, such that the connector pin extends through the perforation hole.

2. The battery module according to claim 1, wherein each of the plurality of battery cells includes:
   an electrode assembly;
   a pair of electrode leads connected to the electrode assembly and extending in opposite directions along a longitudinal direction of the battery cell; and
   a cell case accommodating the electrode assembly and sealed to expose the pair of electrode leads to an outside of the cell case.

3. The battery module according to claim 2, wherein the pair of electrode leads are formed at locations biased below a center of the cell stack in a height direction.

4. The battery module according to claim 3, wherein the bus bar frame has a FPCB placing portion provided in a space formed above the electrode leads of the cell stack due to the biasing of the electrode leads below the center of the cell stack.

5. The battery module according to claim 4, wherein the connector mounting portion is placed on the FPCB placing portion.

6. The battery module according to claim 5, wherein the connector is mounted onto the connector mounting portion.

7. The battery module according to claim 4, wherein the bus bar frame has a fixing pin provided in the space formed above the electrode leads of the cell stack due to the biasing of the electrode leads below the center of the cell stack.

8. The battery module according to claim 7, wherein the connector has a fixing portion in which a fixing hole is formed, and the fixing pin of the bus bar frame is inserted into the fixing hole.

9. A battery pack, comprising the battery module according to claim 1.

10. A vehicle, comprising the battery module according to claim 1.

* * * * *